United States Patent [19]

Obata et al.

[11] 4,368,525

[45] Jan. 11, 1983

[54] VIBRATION DETECTOR

[75] Inventors: Sukiro Obata, Tokyo; Naohiro Murayama, Iwaki; Teruo Fujii, Tokyo, all of Japan

[73] Assignee: Kureha Kagaku Kogyo Kabushiki Kaisha, Nihonbashi, Japan

[21] Appl. No.: 165,802

[22] Filed: Jul. 3, 1980

[30] Foreign Application Priority Data

Jul. 11, 1979 [JP] Japan .................................. 54-88547
Mar. 26, 1980 [JP] Japan .................................. 55-38622

[51] Int. Cl.³ ............................................ H04R 17/00
[52] U.S. Cl. ................................. 367/165; 310/329
[58] Field of Search .............. 367/160, 158, 162, 164, 367/165, 180, 161, 163; 310/329, 800, 330, 331

[56] References Cited

U.S. PATENT DOCUMENTS

| 2,880,333 | 3/1959 | Dranetz | 310/329 |
| 3,158,831 | 11/1964 | Boyer | 310/329 |
| 3,241,373 | 3/1966 | Ricketts et al. | 310/329 |
| 4,051,395 | 9/1977 | Taylor | 310/329 |
| 4,183,010 | 1/1980 | Miller | 310/800 |

*Primary Examiner*—Theodore M. Blum
*Attorney, Agent, or Firm*—Wegner & Bretschneider

[57] ABSTRACT

A vibration detector of the seismic system comprises
a weight member;
a support frame;
at least two weight supporting members, each of the supporting members being fixed to the weight member at one end thereof and being substantially fixed to the support frame at one portion thereof in detecting the vibration; and
a member for substantially fixing one portion to the support frame in detecting the vibration; wherein the weight member is vibratively supported by the tension of the supporting members, and at least a part of one of the supporting members is formed by a piezoelectric polymeric substance having a pair of vibration detecting electrodes, the part being at a position between the fixed end and one substantially fixed portion of the supporting member.

16 Claims, 6 Drawing Figures

VIBRATION DETECTOR

This invention concerns a vibration detector of the seismic system and, particularly, it relates to a vibration detector for detecting the vibrations of ground, buildings and machineries by the use of a piezoelectric substance.

Conventional piezoelectric vibration detectors are piezoelectric detector of seismic system in which piezoelectric substance is used as main spring means and a weight member is connected by way of the piezoelectric spring to a casing. Most of the conventional piezoelectric vibration detectors employ inorganic piezoelectric materials such as quartz, barium titanate and lead titanium zirconate as the piezoelectric substance.

The conventional vibration detectors using inorganic piezoelectric material as the piezoelectric sensing element are generally classified into three types according to their structures. In the first type of detectors, a planar piezoelectric sensing element is fixed on a substrate and a weight member is bonded on the element, which utilizes the piezoelectricity by a compressive or tensile stress mainly along the thickness of the element. In the second type of detectors, a cylindrical piezoelectric element is bonded on the periphery of the column substrate and a cylindrical weight member is further bonded on the periphery of the element, which utilizes mainly the shearing stress applied to the piezoelectric element. In the third type of detectors, a bimorph type of piezoelectric element is supported at one end or at the center thereof and a weight member is bonded to the other end if the fulcrum is set at one end or bonded to both of the ends if the fulcrum is set at the center, which utilizes the bending stress applied to the element by the vibrations of the substrate.

However, since the natural frequency or proper vibration frequency of the piezoelectric ceramic substance is extremely high, piezoelectric detectors using such piezoelectric inorganic material are not suitable, by nature, as a vibrational displacement detector or a vibrational velocity detector for a frequency range lower than 10 kHz and actually they are generally used as a vibrational acceleration detector. In the specification, the vibrational displacement detector means the vibration detector to detect the displacement according to the vibration, the vibrational velocity detector means the vibration detector to detect the time derivative of the displacement according to the vibration, and the vibrational acceleration detector means the vibration detector to detect the second order time derivative of the displacement according to the vibration. Although it has been tried to apply these piezoelectric ceramics to a vibrational displacement detector, the displacement detector using piezoelectric ceramics has only a low sensitivity.

While it is contemplated to replace the inorganic piezoelectric material with polymeric piezoelectric material in the vibration detector, it is difficult to attain the advantages of the piezoelectric polymeric substance by merely substituting the piezoelectric polymeric substance for the piezoelectric inorganic substance leaving the structures in the conventional vibration detectors as they are.

The structures of the first and second types of conventional vibration detectors are suitable for the measurement of high frequency vibrations but the sensitivities of these detectors decrease as the vibration frequency goes lower. The conventional structure of the third type of detector may be applied to the low-frequency vibration detector. But its sensitivity will become extremely low especially to the high frequency of vibration because the mass of the weight member should be very small.

As the vibration detectors for use with the vibration frequency as low as 1-10 Hz, a seismograph, for example, is known in which the relative movement of a weight member connected through the elastic member to a support frame is directly recorded on a recording sheet secured to the support frame by a pen secured to the weight member.

The seismograph can not, however, convert the vibrations directly to electric signals. Moreover, since the directions of the vibration that can be detected is actually restricted, a plurality of seismographs have to be provided together for the detection of vibrations in many directions.

The object of this invention is to provide a vibration detector using a piezoelectric polymeric substance that can be used as a vibrational displacement detector and a vibrational velocity detector as well as a vibrational acceleration detector.

Another object of this invention is to provided a vibration detector which has higher sensitivities than the conventional vibration detectors using the piezoelectric ceramics.

These objects can be attained by a vibration detector of seismic system which comprises
  a weight member;
  a support frame;
  at least two weight supporting members, each of said supporting members being fixed to said weight member at one end thereof and being substantially fixed to said support frame at one portion thereof in detecting the vibration; and
  a means for substantially fixing said one portion to said support frame in detecting the vibration; wherein said weight member is vibratively or vibrationally supported by tension of said supporting members, and at least a part of one of said supporting members is formed by a piezoelectric polymeric substance having a pair of vibration detecting electrodes, the part being at a position between the fixed end and said one portion, and also by a vibration detector of seismic system which comprises
  a support frame;
  at least one weight supporting member, said supporting member being substantially fixed to said support frame at two portions thereof in detecting the vibration;
  a weight member fixed to said supporting member at a substantially central position between said two portions of said supporting member; and
  a means for substantially fixing said two portions to said support frame in detecting the vibration; wherein said weight member is vibratively or vibrationally supported by tension of said supporting member, and at least a part of said supporting member is formed by a piezoelectric polymeric substance having a pair of vibration detecting electrodes, said part being at a position between said two portions.

Still another object of this invention is to provide a vibration detector which is sensitive even to a very small vibrational force by keeping a piezoelectric polymeric substance under the preferred tensile stress or by preventing the piezoelectric polymeric substance from being loosened on account of its mechanical plasticity.

The still another object can be attained by one of the vibration detectors whose support frame further comprises a means for keeping said supporting member in tensile stress so as to support said weight member vibratively or vibrationally; and a means for supporting said tension keeping means.

Now preferred embodiments of the present invention are described referring to accompanying drawings, wherein above-mentioned objects and features as well as other objects and features will become clearer.

Figure 1:
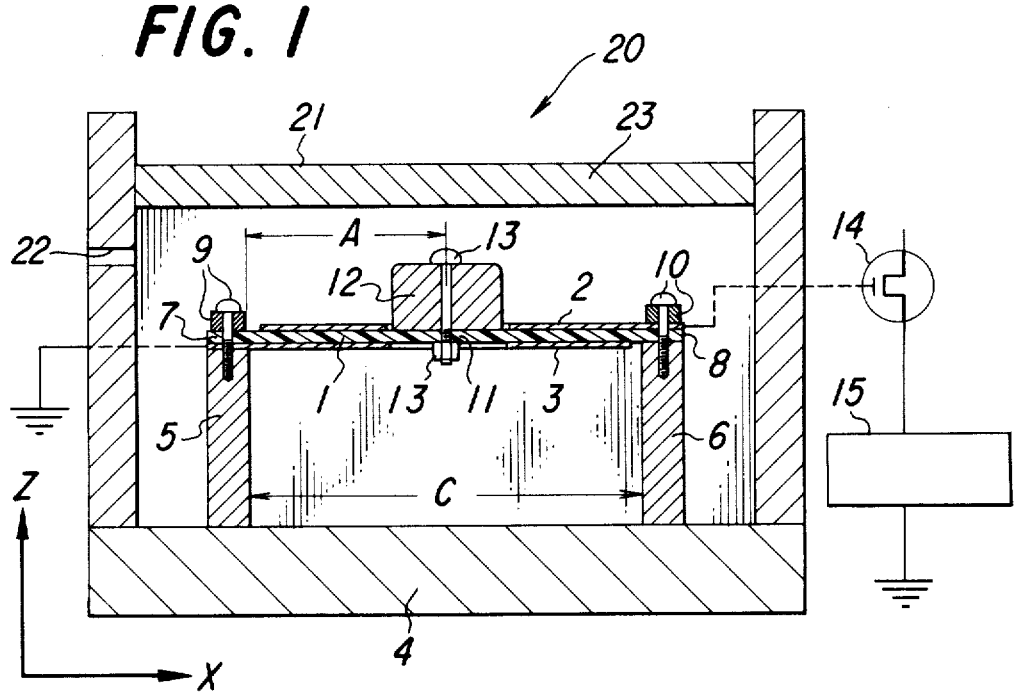
FIG. 1 is a sectional front view of the first preferred embodiment of the vibration detector according to this invention.

Referring to a vibration detector as the first embodiment in FIG. 1, thin film electrodes 2, 3 are deposited on both sides of a piezoelectric polymeric film 1. The piezoelectric film 1 is secured at its both ends 7, 8 by fixing members 9, 10 to side walls (or supporting posts) 5, 6 of a substrate 4, and a weight member 12 is secured by a securing member 13 at the center 11 of the piezoelectric film 1. In FIG. 1 one sheet of strip-like piezoelectric polymeric film is shown, but piezoelectric polymeric film 1 may comprise two sheets of piezoelectric film, one end of one film being fixed to the side wall (or supporting post) 5, one end of another film being fixed to the side wall (or supporting post) 6, and another end of each film being fixed to the weight member 12. In FIGS. 2 to 6, piezoelectric polymeric film comprises either one or two sheets, but number of the films may also be changed from one to two or from two to one. The side walls 5, 6 and the substrate 4 constitute a support frame. One of the electrodes, i.e., the electrode 2 is connected, for example, by way of a field effect transistor as an impedance conversion circuit 14 to an appropriate measuring circuit 15 such as an ampere meter, a voltmeter, an oscilloscope and the like. The other electrode 3 is connected to the grounding terminal of the meter circuit 15. The meter circuit 15 may include a band pass filter or the like that transmits only the signals having a desired range of frequencies. The impedance conversion circuit 14 can be replaced, as shown in FIG. 3, with an amplifier 19 comprising an operational amplifier 16, a capacitor 17, a resistance 18 and the like to detect the current.

The piezoelectric polymeric substances usable in this invention are polyvinylidene fluoride type substances, for example of vinylidene fluoride homopolymer, a copolymer of vinylidene fluoride and at least one comonomer copolymerizable therewith, for example a halogenoalkene such as vinyl fluoride, tetrafluoroethylene or chlorotrifluoroethylene, the copolymer containing more than 50 mol% of vinylidene fluoride units in the main polymer chain, or a composition consisting predominantly of such a homopolymer and/or copolymer and also containing a compatible resin, for example poly (methyl methacrylate) or poly (methyl acrylate). Other materials may be included in the composition.

The vibration detector shown in FIG. 1 is a vibration detector of the seismic system utilizing the piezoelectric polymeric film 1 as spring means. Since the polymeric piezoelectric material has a high mechanical-electric coupling constant g and can be shaped much longer as compared with piezoelectric ceramic material, an excellent sensitivity can be obtained.

In this system, the natural frequency or proper vibration frequency of the detector can optionally be varied by the changes in the mass of the weight member, as well as the changes in the tension and the length of the piezoelectric polymeric substance. Further, in the case where the piezoelectric polymeric material is configured as the film 1, since the vibrations of the stretched film are greatly damped by the pneumatic resistance, the damping factor can be varied with ease, for example, by the provision of a casing 21 surrounding the vibration detector 20 and by changing the gap or the space between the casing 21 and the film 1, the size of air hole 22 formed to the casing 21, the hole 22 communicating the chamber in the casing 21 with the surrounding of the casing 21.

As is already known the characteristics of the vibration detector 20 of the seismic system is shown by the natural frequency or proper vibration frequency $f_n$ and the damping factor h. The frequency $f_n$ of the vibrational system in which the stretched film 1 and the weight member 12 are coupled can optionally be varied by changing the film tension, mass of the weight member 12, the position for the center of gravity of the weight member 12 in the longitudinal direction of the film 1 (that is, the distance A from the supporting post 5 to the center of gravity of the weight member 12). The frequency $f_n$ can also be varied by changing the dimensions of the film 1 such as width B, length C of the film 1.

In the vibration detector 20, the film tension can be varied with ease by configuring the supporting post 5 or 6 movable to the substrate 4 in the longitudinal direction of the film 1, and the length of the film 1 can be varied with ease by extending a rigid film grasping member from the support posts 5, 6. The vibration detector 20 with a desired proper vibration frequency can therefore be obtained irrespective of the size and configuration of the support frame. Therefore, the size of the support frame can also be selected optionally. Accordingly, by securing the substrate 4 to the desired portions of building walls or floors, and machine frames to be detected, vibrations of buildings and machine frames can be detected. In addition, the damping factor h can be set with ease so as to attain an appropriate damping, for example, by making the upper wall 23 of the casing vertically moveable or by changing the diameter of the aperture 22.

Accordingly, the vibration detector 20 is used not only as the vibrational acceleration detector but it can freely be adapted as a vibrational displacement detector or a vibrational velocity detector.

The vibration detector 20 can detect the vibration in the direction not only perpendicular to the plane of the strip-like film 1 but also in the lateral direction of the film 1, the lateral direction being perpendicular to the longitudinal direction. In the case of the strip-like film 1 fixed at both ends 7, 8, when the width B of the piezoelectric film 1 is extremely short as compared with the length C thereof, charges induced on the left half of electrodes 2, 3 according to the expansion/contraction of the left half of the film 1 and charges induced on the right half of electrodes 2, 3 according to contraction/expansion of the right half of the film 1 are neutralized at each of the electrodes 2, 3 for the transverse vibration, vibration along X axis. Since substantially all the parts of the film 1 are expanded and contracted alternately in the transverse vibration perpendicular to the length of the film 1 (vibration along Y axis) as in the case of the vibration in the direction perpendicular to the film plane (vibration along Z axis), the charges induced on electrodes 2, 3 according to the expansion and contraction of the piezoelectric polymeric film 1 can be detected. Thus, the vibration detector 20 also has a high transverse sensitivity and can detect transverse vibration perpendicular to the longitudinal direction of the film as well as the vertical vibration. But even in this vibration detector 20, the transverse sensitivity is decreased as the width B become larger.

Figure 4:
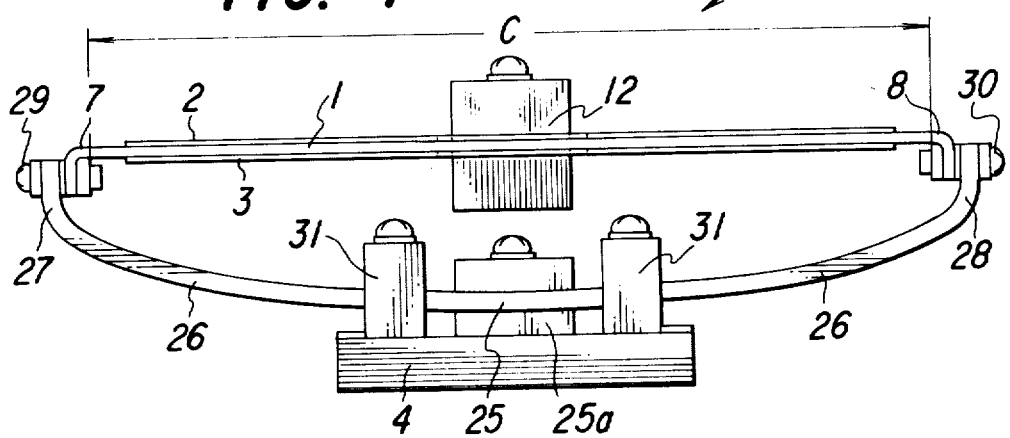
FIG. 4 is a front view of the second preferred embodiment of the vibration detector according to this invention.

FIG. 4 shows a vibration detector 24 as the second preferred embodiment of this invention, by which said still another object of this invention can be accomplished. In the vibration detector 24, a piezoelectric polymeric film 1 deposited with electrodes 2, 3 and secured with a weight member 12 is fixed at its both ends 7, 8 by fixing members 29, 30 such as threads to the ends 27, 28 of an arcuate leaf spring 26 respectively which is, in turn, secured at its center portion 25 to a substrate 4 by securing member 25a. The arcuate leaf spring 26 operates as a means for keeping the supporting member (film 1) in tensile stress so as to support the weight member 12 vibratively or vibrationally. The film 1 is stretched by the resiliency of the spring 26. In detecting the vibration, the substrate 4 is fixed to those bodies to be detected for vibrations such as ground, buildings, machineries and the likes. The tension of the film 1 can be controlled by the adjustment of the curvature in the spring 26. The curvature in the spring 26 can be adjusted, for example, by holding the spring 26 with the holding member 31 and changing the holding position of the spring 26 in the holding member 31 vertically in FIG. 4 or changing the fixing positions of the ends 27, 28 with the fixing members 29, 30. The spring 26 is made of an elastic metal member such as of phosphor bronze plate. The modulus of elasticity of the spring 26 can be made sufficiently higher than that of the film 1.

Figure 5:
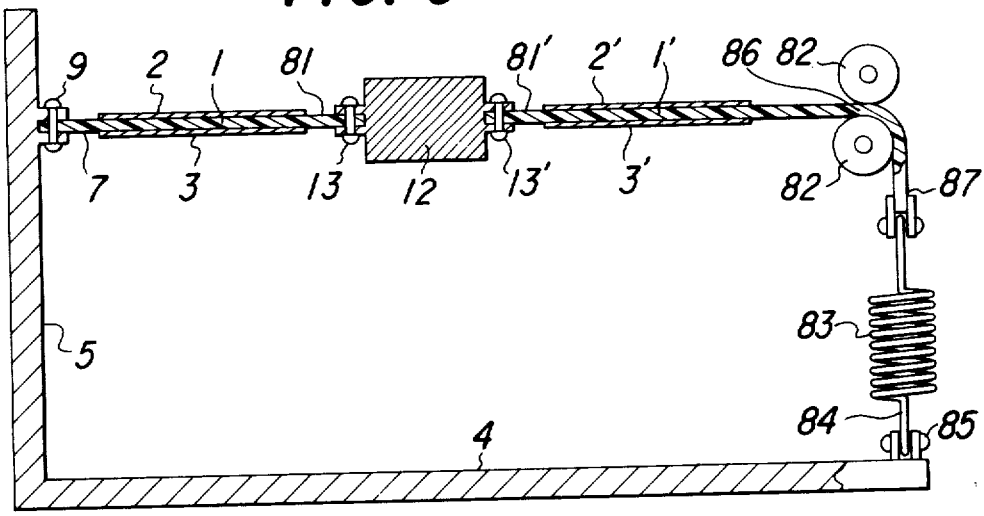
FIG. 5 is a sectional front view of the third preferred embodiment of the vibration detector according to this invention.

FIG. 5 shows the third preferred embodiment of a vibration detector 80 according to this invention, by which said still another object can be also accomplished. The vibration detector 80 has two piezoelectric polymeric films 1, 1', each of the films 1, 1' having a pair of electrodes 2, 3 or 2', 3'. The film 1 is fixed to the side wall 5 by the fixing member 9 at one end 7 thereof and to the weight member 12 by the fixing member 13 at another end 81 thereof. The film 1' is fixed to the weight member 12 by the fixing member 13' at one end 81' thereof and is pinched by a pair of nipping rollers 82 at an intermediate portion 86 thereof where no electrode is deposited. Rotational axes of the rollers 82 are supported by the frame fixed to the substrate 4 (not shown). The extended end 87 of the film 1' is fixed to one end of a coil spring 83, another end of the spring 83 being fixed to an end of the substrate 4 by the fixing member 85. The spring 83 operates as a means for keeping the supporting member (films 1, 1') in tensile stress so as to support the weight member 12 vibratively or vibrationally.

The nipping rollers 82 substantially prevent the relative vibration of the weight member 12 to the vibrational system except for the weight member 12 from being reduced by the spring 83 in case of vibration, that is, the rollers 82 operate as a means for substantially fixing the intermediate portion 86 of the film 1' in case of vibration (portion 86 may be regarded as the fixed end). Furthermore, the rollers 82 operate as a means for transmitting the tensile force of the spring 83 to the piezoelectric polymeric films 1, 1' in order to keep the films 1, 1' in the desired tensile stress when the vibration is not detected.

Figure 6:
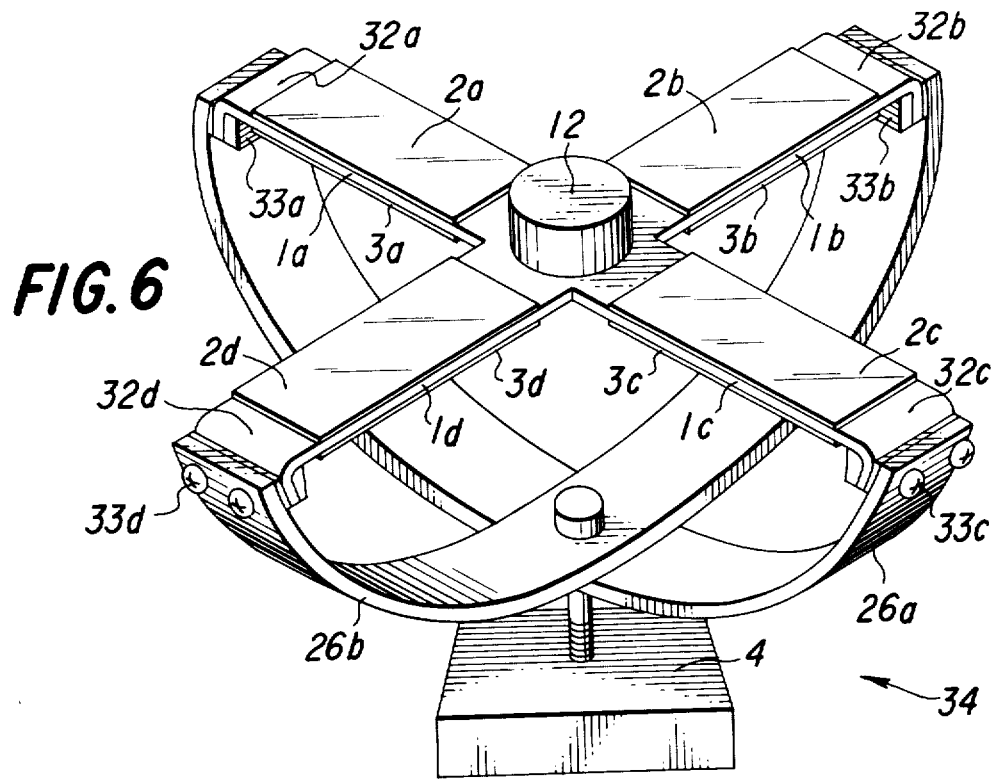
FIG. 6 is an oblique view of the fourth preferred embodiment of the vibration detector according to this invention.

FIG. 6 shows the forth preferred embodiment of a vibration detector 34 having piezoelectric polymeric films 1a, 1b, 1c, 1d, a weight member 12, two arcuate leaf springs 26a, 26b and substrate 4. The film 1a having a pair of electrodes 2a, 3a is fixed to one end of the spring 26a at one end 32a thereof by the fixing member 33a, the film 1b having a pair of electrodes 2b, 3b is fixed to one end of the spring 26b at one end 32b thereof by the fixing member 33b, the film 1c having a pair of electrodes 2c, 3c is fixed to another end of the spring 26a at one end 32c thereof by the fixing member 33c, and the film 1d having a pair of electrodes 2d, 3d is fixed to another end of the spring 26b at one end 32d thereof by the fixing member 33d. Films 1a, 1b, 1c, 1d are integrally connected to each other to form a cross, and a weight member 12 is fixed to the film 1a, 1b, 1c, 1d at the center of the cross. Two arcuate leaf springs 26a, 26b are crossed and coupled to each other at the center thereof, the center of the springs 26a, 26b being fixed to the substrate 4. The substrate 4 is fixed to the body such as the building and the machine, the vibration of which is to be detected. The arcuate leaf springs 26a, 26b operate as a means for keeping the tensions in the piezoelectric polymeric films 1a, 1b, 1c, 1d as the weight supporting members so as to support the weight member 12 vibratively or vibrationally.

The vibration detector 34 can detect the vibration in all spatial directions. The one-fold piezoelectric polymeric film of the vibration detector shown in FIG. 1, 2, 4, 5 or 6 may be replaced by the conventional bimorph which comprises even number of the piezoelectric polymeric films which are laminated with each other.

The vibration detectors according to this invention have been described referring to the preferred embodiments using thin piezoelectric polymeric film and the explanation will then be made for the vibration detectors of this invention using tubular piezoelectric polymeric substance.

Figure 7:
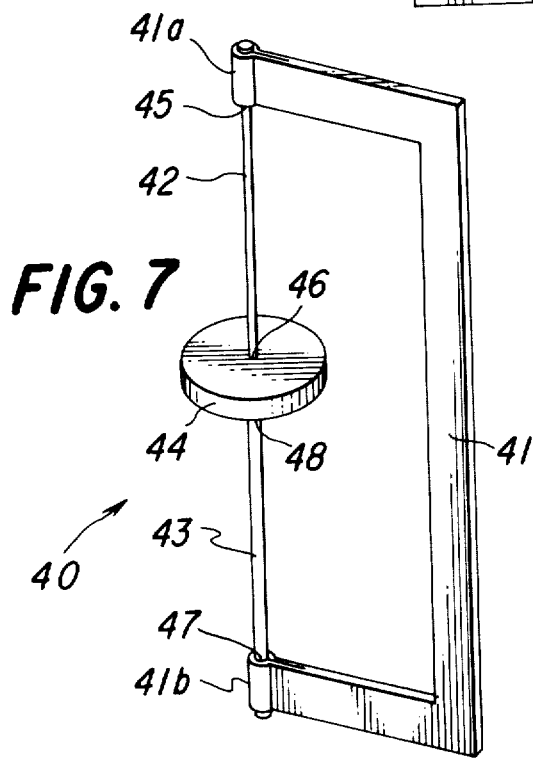
FIG. 7 is an oblique view of the fifth preferred embodiment of the vibration detector according to this invention.
Figure 8:
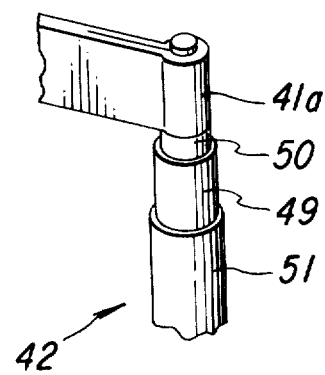
FIG. 8 is an explanatory enlarged oblique view for a part of the detector shown in FIG. 7.

FIG. 7 shows a vibration detector 40 as the fifth preferred embodiment of this invention.

The vibration detector 40 comprises a support frame 41, thready vibration detecting members 42, 43 as the weight supporting members and a disc-like weight member 44. The detecting member 42 is fixed at one end 45 to one end 41a of the support frame 41 and secured at the other end 46 to the center of the weight member 44. The detecting member 43 is fixed at one end 47 to another end 41b of the support frame 41 and secured at the other end 48 to the center of the weight member 44. The weight member 44 is stretched by the linear vibration detecting members 42, 43 which are under the tensile stress. The support frame 41 is secured to the objects such as ground, buildings and machineries whose vibrations are to be detected.

Each of the vibration detecting members 42, 43 is constituted in the same manner. For example, the detecting member 42 comprises a tube 49 of a circular cross section made from piezoelectric polymeric material, an internal electrode 50 made of conductive material filled to the inside space of the tube 49 and an external electrode 51 deposited to the outer periphery of the tube 49. The tube 49 is made from the same piezoelectric polymeric material as that for the film 1 and the tube 49 composed of the piezoelectric material is polarized in the radial direction (inwardly or outwardly).

The internal electrode 50 in the detecting member 42 is composed of conductive material having liquidity at a temperature below the melting point of the piezoelectric polymeric material for the tube 49. The desired conductive material includes metal alloys having low melting points, electrolytic solutions, conductive resins and conductive rubbers. The external electrode 51 may be made of vapor deposited film such as of aluminum.

The expansion and contraction in the vibration detecting member 42 can be detected as voltage changes between the electrodes 50, 51 or the changes in the amount of charges on the electrodes 50, 51 and are indicated by the circuit shown in FIG. 1 or FIG. 3. The detection circuit may comprise, for example, a preamplifier, a band pass filter for a predetermined frequencies of signals, an amplifier and the like and may include an alarming device and a circuit to prevent the secondary calamity on account of the vibration.

Where the vibration detector 40 is employed to detect an earthquake, a band pass filter is used which allows to pass only the signals having the frequencies corresponding to the seismic frequencies, that is, the frequencies in the range of 1-10 Hz and, in particular, 3-7 Hz. The circuit to prevent the secondary calamity may be employed for closing the main valves for gas or oil conduit pipes or switching off the power supplies.

Where the tube 49 has a circular cross section and the weight member 44 is made of a disc-like configuration, the linear detecting members 42, 43 can produce the same amount of piezoelectric charges for the stress applied in any direction perpendicular to the axial direction (longitudinal direction) of the detecting members 42, 43, and the detector 40 can sense the vibrations in the plane vertical to the axial direction with no directional dependency at all. In addition, the amount of the generated piezoelectric charges by the vibration including seismic vibration is sufficiently large to be applied as the signal for the detection of various vibrations and the detector 40 can be employed as a practical high sensitivity vibration detector.

The detecting members 42, 43 may be integrated as one piezoelectric member passing through the center of the weight member 44 and fixed to the weight member 44 at the positions 46, 48. Either one of the supporting members 42, 43 may be an elastic member which is not made from the piezoelectric material.

Explanation is to be made for the operation of the detector 40 having the foregoing constitutions. When an earthquake occurs, the support frame 41 secured to the ground is vibrated by the seismic transverse waves, for example, and displaced relatively to the weight member 44. As the result, the detecting members 42, 43 secured at the ends 46, 48 to the weight member 44 respectively are expanded and contracted due to the changes in their tension, by which piezoelectricity is produced between the internal electrode 50 and the external electrode 51. The piezoelectric charges thus produced is detected by an electric signal detection circuit and amplified for recording or for actuating the circuit to prevent the secondary calamity.

Figure 9:
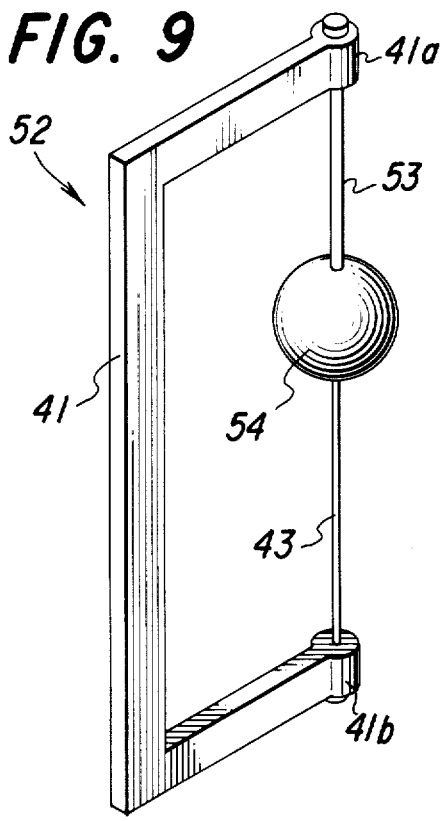
FIG. 9 is an oblique view of the sixth preferred embodiment of the vibration detector according to this invention.

FIG. 9 shows a vibration detector 52 as the sixth preferred embodiment of this invention.

The detector 52 comprises a vibration detecting member 43 and a metal wire 53 as the weight supporting members. While the spherical weight member 54 is illustrated, the weight member 54 may be of a disc-like configuration. Since the supporting member 53 which is always put under the tensile stress due to the load of the weight member 54 is made as the metallic wire in the detector 52, it is less likely for the supporting member 53 to be deformed by the load for a long time. In addition, the support member 53 can support the weight member 54 within the elastic limit for the relatively heavy load. Since the amount of the produced piezoelectric charges on each of the internal electrode 50 and the external electrode 51 by the expansion and contraction of one vibration detecting member 43 secured to the weight member 54 is changed according to the vibration, the vibration including seismic vibration can be detected. The constituent material for the supporting member 53 is not restricted only to the metal wire but any other elastic members including fibers can be used so long as they can endure the load of the weight member 54 and they are expanded or contracted much less than the detecting member 43. Further a part of the elastic member such as the metal wire may be replaced with the vibration detecting member.

Figure 10:
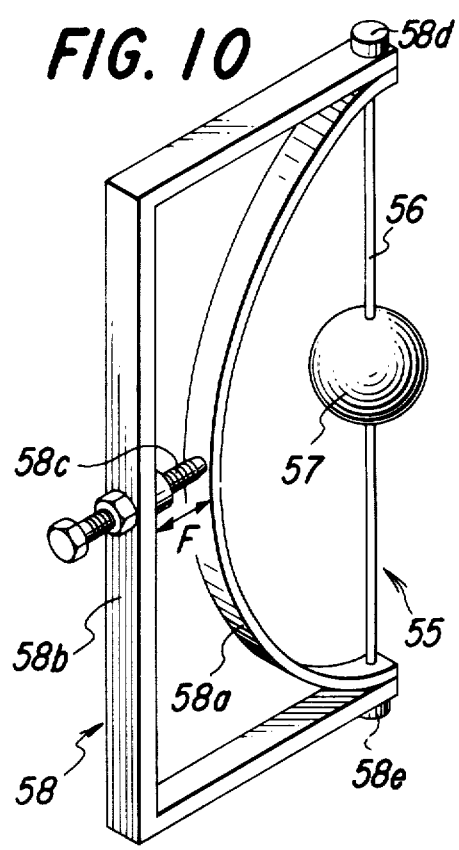
FIG. 10 is an oblique view of the seventh preferred embodiment of the vibration detector according to this invention.

The seventh preferred embodiment of a vibration detector 55 according to this invention is shown in FIG. 10. The vibration detector 55 comprises a thready vibration detecting member 56, a weight member 57 fixed to the center of the detecting member 56, and a support frame 58. The support frame 58 includes an arcuate member 58a, a base member 58b and fixing members 58c, 58d, 58e. The base member 58b supports the arcuate member 58a through the fixing members 58c, 58d, 58e. The arcuate member 58a operates as a means for keeping the vibration detecting member 56 (as the weight supporting member) in tensile stress so as to support the weight member 57 vibratively. In the detector 55 as in the detectors 34 and 80, the tension of the weight supporting member and the natural frequency or proper vibration frequency can be adjusted to a desired value by changing the distance F between the base member 58b and the center of the arcuate member 58a. In this case, the base member 58b is slightly deformed.

The distance F can be varied by changing the fixed position of the fixing member 58c with the base member 58b.

Figure 11:
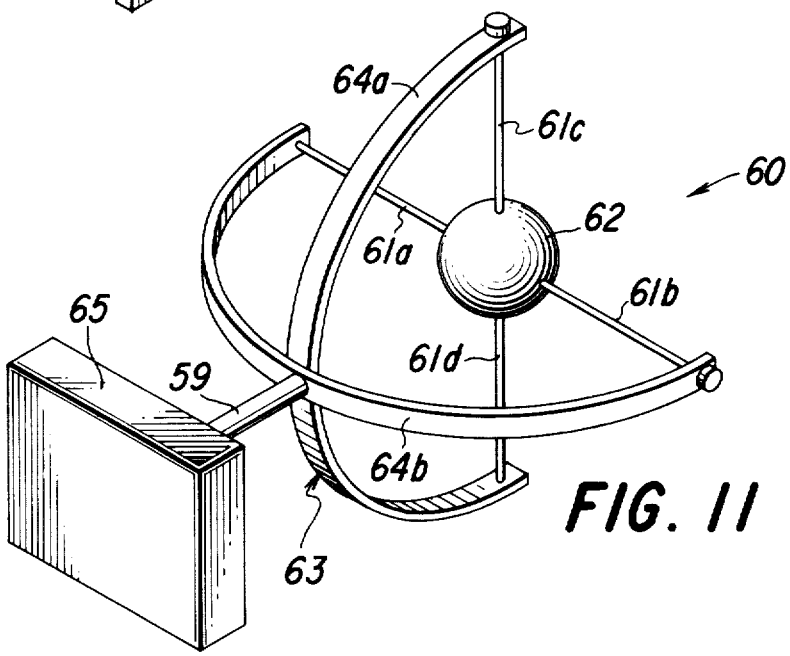
FIG. 11 is an oblique view of the eighth preferred embodiment of the vibration detector according to this invention.

The eighth preferred embodiment of a vibration detector 60 according to this invention is shown in FIG. 11. The vibration detector 60 comprises four vibration detecting members 61a, 61b, 61c, 61d, a spherical weight member 62 and a support frame 63.

The support frame 63 has two arcuate members 64a, 64b and a base plate 65 supporting the arcuate members 64a, 64b through connecting rod 59. Each of the detecting members 61a, 61b, 61c, 61d is fixed to the weight member 62 at one end thereof and to an end of the arcuate member 64a or 64b at another end thereof. Two of the detecting members extend generally horizontally and the other two extend generally vertically. The arcuate members 64a, 64b are means for keeping the vibration detecting members 61a, 61b, 61c, 61d (as the weight supporting members) in tensile stress so as to support the weight member 62 vibratively or vibrationally.

The vibration along any directions can be detected and indicated by giving the output signals of the detecting members 61a, 61b, 61c, 61d to a desired electrical circuit or device.

Figure 12:
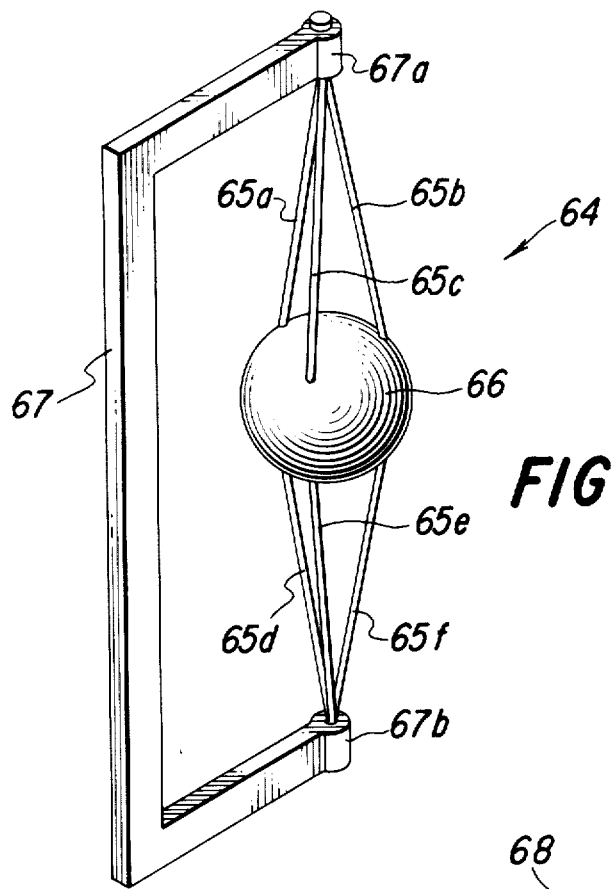
FIG. 12 is an oblique view of the ninth preferred embodiment of the vibration detector according to this invention.

FIG. 12 shows a vibration detector 64 as the ninth preferred embodiment of this invention.

The detector 64 comprises six vibration detecting members 65a, 65b, 65c, 65d, 65e, 65f, a spherical weight member 66 and a support frame 67. The both ends of the detecting members 65a, 65b, 65c, 65d, 65e, 65f are secured respectively to the weight member 66 and the support frame 67 so as to support the weight member 66.

Three detecting members 65a, 65b, 65c among the six members are fixed to the end 67a of the support frame 67 and the remaining three detecting members 65d, 65e, 65f are fixed to the other end 67b of the support frame 67.

The detector 64 can detect with ease, for example, the propagating direction of the seismic transverse waves by the magnitudes of the piezoelectricity produced in the detecting members 65a, 65b, 65c, 65d, 65e, 65f when the relative vibrational direction of the weight member 66 to the support frame 67 is substantially horizontal.

Figure 13:
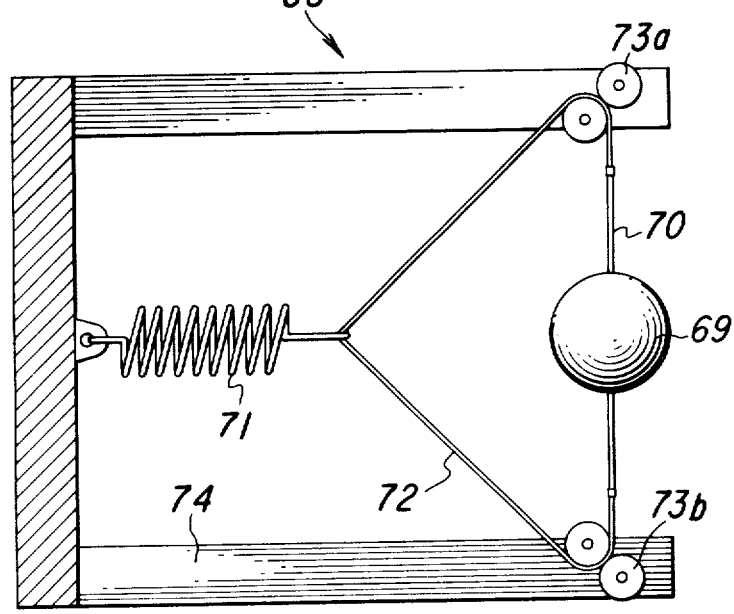
FIG. 13 is a sectional front view of the tenth preferred embodiment of the vibration detector according to this invention.

The tenth preferred embodiment of a vibration detector 68 according to this invention is shown in FIG. 13.

The vibration detector 68 comprises a spherical weight member 69, a vibration detecting member 70, a coil spring 71, a fiber 72, two pairs of nipping rollers 73a, 73b and a frame 74. The weight member 69 is fixed at the central portion of the detecting member 70.

The detecting member 70 is fixed to the ends of a fiber 72 at the ends thereof. The fiber 72 is pinched by two pairs of nipping rollers 73a, 73b at portions near the ends thereof, and is connected to one end of the spring 71 at a center thereof, another end of the spring member 71 being fixed to the frame 74. The fiber 72 and the spring 71, as a whole, is formed as "Y".

The rotation axes of nipping rollers are fixed to the frame 74. The spring 71 is a means for keeping the vibration detecting member 70 in tensile stress so as to support the weight member 69 vibratively or vibrationally. The nipping rollers 73a, 73b substantially prevent the relative vibration of the weight member 69 to the seismic vibration system except for the weight member 69 from being reduced by the spring 71 in case of vibration, that is, the rollers 73a, 73b operate as a means for substantially fixing the pinched portions of the fiber 72 in case of vibration. In this case, the weight supporting member comprises the vibration detecting member 70 and the fiber 72, which shows that the weight supporting member may be formed by the combination of the vibration detection member with the other members.

EXAMPLE 1

Figure 2:
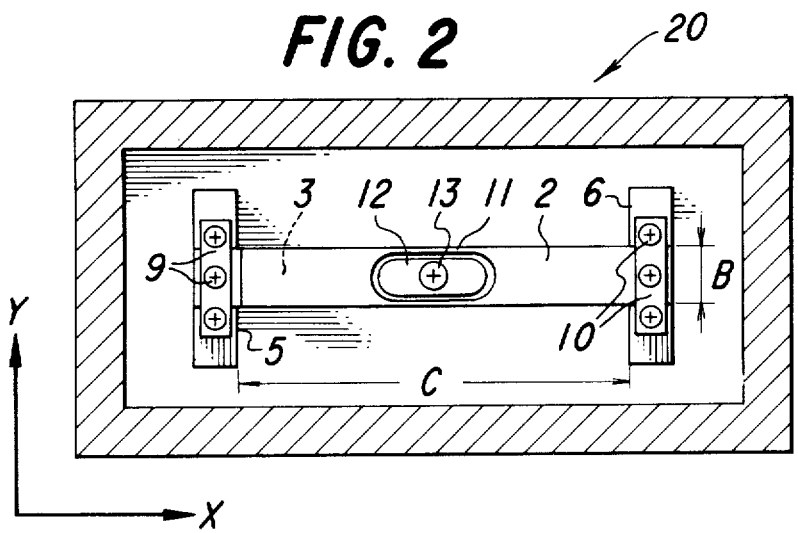
FIG. 2 is a sectional plan view of the first preferred embodiment of the vibration detector according to this invention.
Figure 3:
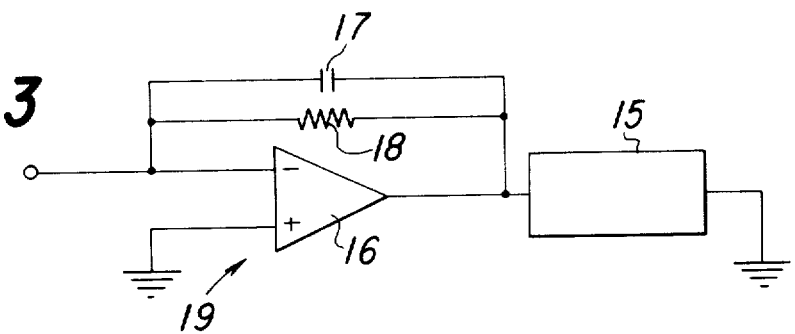
FIG. 3 is a diagrammatic view of a detection circuit applied to the first preferred embodiment of the vibration detector according to this invention.

A vibration detector D3 as shown in FIGS. 1 to 2 was prepared by using a piezoelectric polyvinylidene fluoride film with $30\mu$ thickness, 10 mm width B and piezoelectric constant $d_{31}$ of $7 \times 10^{-7}$ cgsesu, having aluminum vapor deposited films on both surfaces (if the film is positioned such that the longitudinal direction C of the film 1 is in parallel with the axis X and the surface of the film 1 is in parallel with the surface XY, the piezoelectric constant $d_{31}$ is defined as: $d_{31} = D/F$, where F = stress applied to the film in the direction X and D = electric flux density in the direction Z). The free vibrating length C of the film 1 was set to 60 mm and the mass of the weight member was set as 3.16 gr.

The vibration detector D3 was fixed on a vibration bed as the substrate 4. The vibrations were applied while changing the frequency and keeping the amplitude of the vibration bed constant ($10\mu$) and the output voltage between the electrodes 2, 3 was measured. An oscillograph was employed as the meter circuit 15.

As the result of the measurement, it was observed that the vibration detector D3 has 28 Hz of resonance frequency and the detector D3 operates as a vibrational displacement detector in frequencies over the resonance frequency having a sensitivity of 1.8 V output voltage/1 mm vibration amplitude.

EXAMPLE 2

A vibration detector D1 as shown in FIG. 4 was prepared in which the same piezoelectric polyvinylidene fluoride film 1 as used in Example 1 was stretched between both ends of a leaf spring 26 made of a phosphor bronze plate (PBSP. 0.25 mm thickness, 10 mm width and having small notches on both sides near the film holding positions at both ends) and secured on the substrate 4, and a weight member 12 of 3.16 gr. was secured to the center of the film 1. The free vibration length C of the piezoelectric film 1a was 50 mm. Since the natural frequency in the vertical vibrations of the phosphor bronze leaf spring 26 of the vibration detector D1 was made sufficiently greater than that of the piezoelectric film 1 so that the effects of the elastic vibrations from the spring 26 are negligible upon measuring vibrations in the vibrating frequency range near the natural frequency of proper vibration frequency of the piezoelectric film 1, the spring 26 may be considered as a part of the substrate 4.

The correlation data between the frequency and the output voltage were taken using this vibration detector D1 under the same conditions as in Example 1. As the result, it was observed that this vibration detector D1 was a vibrational displacement detector of the vibration having the frequencies well over 25 Hz (the resonance frequency of the film 1 was 25 Hz), with a sensitivity of 10 V output voltage/1 mm vibration amplitude.

EXAMPLE 3

A vibration detector 24 similar to that in Example 2 was prepared with modifications to the constitution of the phosphor bronze leaf spring 26. The vibration detector 24 of Example 3 was the same as that in Example 2 excepting the use of the phosphor bronze spring 26 of a 10 mm width and 0.3 mm thickness having no notches. The resonance frequency was 51 Hz and the output sensitivity was 1.8 V/1 mm.

When the mass of the weight member 12 of the vibration detector 24 was increased to 7.16 gr. the resonance frequency changed to 39 Hz and the output sensitivity was increased to 2.5 V/1 mm. When the weight member 12 was further increased to 11.96 gr., the resonance frequency changed to 28 Hz and the output sensitivity was increased to 3.2 V/1 mm.

EXAMPLE 4

The sensitibities S (PC/gal or pico-coulombs/gal: S=Q/Ac, where Q is the maximum amount of surface charges because of the produced piezoelectricity, and Ac is the acceleration amplitude of the vibration to be measured) of five vibration detectors D1, D2, D3, D4, D5 to the low-frequency vibration were measured. The detector D2 is the same as the detector D1 (of the Example 2) except that the mass of the weight member thereof is 12.23 gr. The detector D3 is the detector of the Example 1.

The detector D4 is prepared as shown in FIG. 10. In the detector D4, the mass of the weight member is 3.16 gr. and the free vibration length between two fixed ends of the vibration detecting member is 50 mm. The piezoelectric constant of the piezoelectric polymeric substance of the vibration detecting member is $7.0 \times 10^{-7}$ cgsesu.

The detector D5 is the conventional vibrational acceleration detector on the market known as "VT-5331" that is manufactured by ECG.

The vibration detecting member for the detector D4 was prepared in the following way: Firstly the fused polyvinylidene fluoride was extruded to form a tube having 500 μm of inner diameter and 800 μm of outer diameter.

Secondly, "low-temperature solder-62" (trademark), the solder having 62° C. of melting point, was injected in the hole of the tube. Thirdly after closing up both ends of the tube, the tube was stretched to 3.5 times in length at 80° C. and was formed as a capillary tube having 250 μm of inner diameter and 450 μm of outer diameter, and the inner surface of the capillary tube being covered with the solder as the inner electrode. And then, aluminium was deposited on the periphery of the capillary tube by the vaccum deposition.

Figure 14:
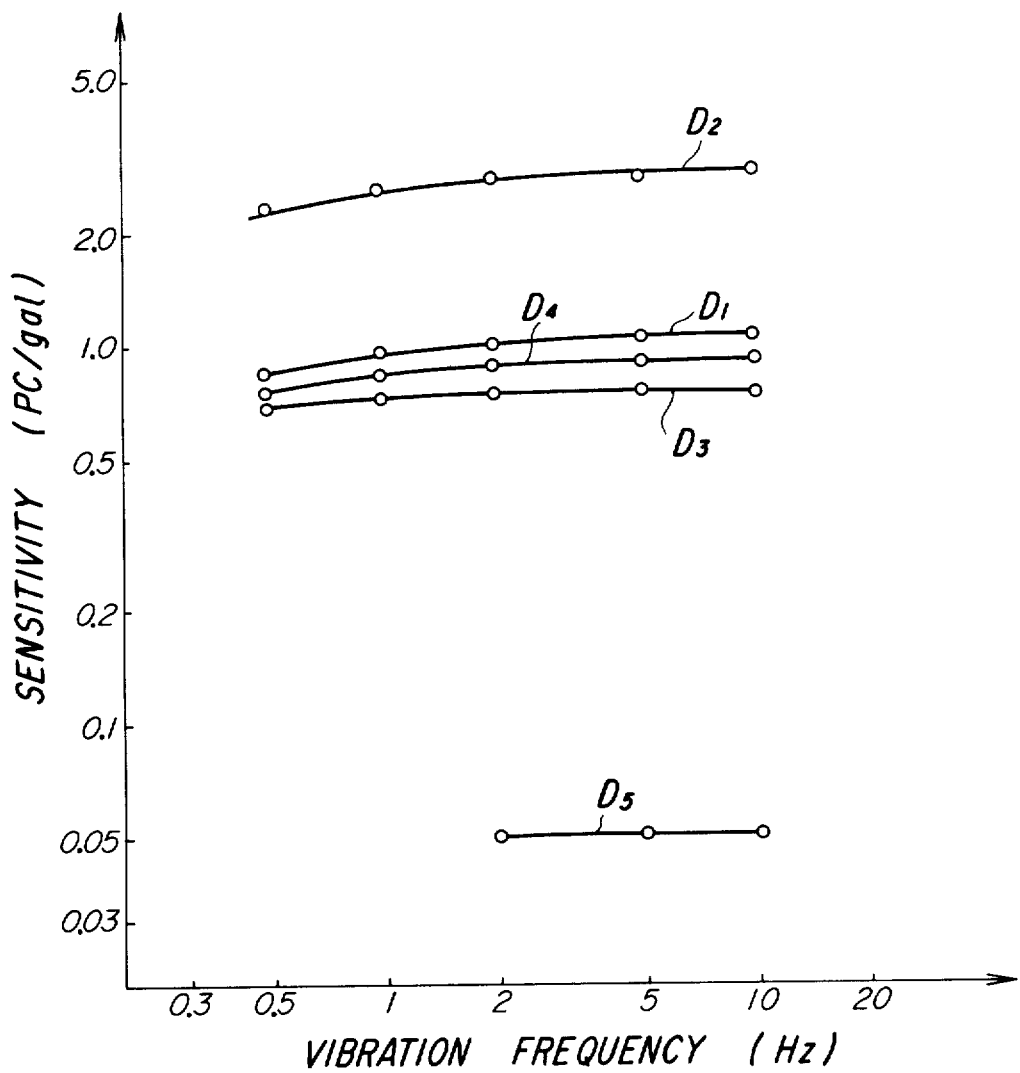
FIG. 14 is a comparative graph showing the low frequency sensitivities of the vibration detectors according to this invention and of the ceramic vibration detector on the market.

The measured sensitivity data are shown in FIG. 14, which clearly suggests that the vibration detectors D1, D2, D3, D4 of this invention have higher sensitivity than the conventional vibration detector D5.

What is claimed is:
1. A vibration detector for a seismic system comprising:
   a weight member,
   a support frame,
   at least two weight supporting members, each of said supporting members being fixed to said weight member at one end thereof and being substantially fixed to said support frame at one portion thereof in detecting the vibration, and
   a means for substantially fixing said one portion to said support frame in detecting the vibration,
   wherein said support frame comprises a means for keeping said supporting member in tensile stress so as to support said weight member vibratively and a means for supporting said means for keeping the supporting member in tensile stress, said weight member is vibratively supported by tension of said supporting members, and at least a part of one of said supporting members is formed by a piezoelectric polymeric substance having a pair of vibration detecting electrodes deposited on a part of each surface of the piezoelectric polymeric substance, the part being at a position between the fixed ends of the supporting member.

2. A detector as claimed in claim 1, wherein said tension keeping means comprises
   an arcuate elastic member, said arcuate elastic member being fixed to said one portion of one of said supporting members at one end thereof and to said one portion of another of said supporting members at another end thereof.

3. A detector as claimed in claim 1, wherein said tension keeping means comprises a spring, said spring being fixed to another end of said supporting member at one end thereof and to said supporting means at another end thereof, and said fixing means comprises a pair of nipping rollers, said rollers being rotatably fixed to said support frame and pinching said one portion of said supporting member.

4. A detector as claimed in any one of claims 2, 3 or 1, wherein at least a part of said supporting member is arranged to form a cross, and said weight member is provided at a center of the cross.

5. A detector as claimed in any one of claims 2, 3 or 1, wherein said piezoelectric polymeric substance is formed as a strip-like film.

6. A detector as claimed in claim 5, wherein at least a part of said supporting member is arranged to form a cross, and said weight member is provided at a center of the cross.

7. A detector as claimed in any one of claims 2, 3 or 1, wherein said piezoelectric polymeric substance is formed as a tubular member.

8. A detector as claimed in claim 7, wherein at least a part of said supporting member is arranged to form a cross, and said weight member is provided at a center of the cross.

9. A vibration detector for a seismic system comprising:
   a support frame,
   at least one weight supporting member, said supporting member being substantially fixed to said support frame at two portions thereof in detecting the vibration;
   a weight member fixed to said supporting member at a substantially central position between said two portions of said supporting member; and
   a means for substantially fixing said two portions to said support frame in detecting the vibration;
   wherein said support frame comprises a means for keeping said supporting member in tensile stress so as to support said weight member vibratively and a means for supporting said means for keeping the supporting member in tensile stress, wherein said weight member is vibratively supported by tension of said supporting member, and at least a part of said supporting member is formed by a piezoelectric polymeric substance having a pair of vibration detecting electrodes deposited on both surfaces of one of the piezoelectric polymeric substances, said part being at a position between the fixed ends of the supporting member.

10. A detector as claimed in claim 9, wherein said tension keeping means comprises an arcuate elastic member, each end of said arcuate elastic member being fixed to each of said two portions of said supporting member.

11. A detector as claimed in claim 9, wherein said tension keeping means comprises a spring, said spring being fixed to another end of said supporting member at one end thereof and to said supporting means at another end thereof, and said fixing means comprises a pair of nipping rollers, said rollers being fixed to said support frame and pinching said one portion of said supporting member.

12. A detector as claimed in any one of claims 10, 11 or 9, wherein at least a part of said supporting member is arranged to form a cross, and said weight member is provided at a center of the cross.

13. A detector as claimed in any one of claims 10, 11 or 9, wherein said piezoelectric polymeric substance is formed as a strip-like film.

14. A detector as claimed in claim 13, wherein at least a part of said supporting member is arranged to form a cross, and said weight member is provided at a center of the cross.

15. A detector as claimed in any one of claims 10, 11 or 9, wherein said piezoelectric polymeric substance is formed as a tubular member.

16. A detector as claimed in claim 15, wherein at least a part of said supporting member is arranged to form a cross, and said weight member is provided at a center of the cross.

* * * * *